(12) United States Patent
Park et al.

(10) Patent No.: US 11,600,662 B2
(45) Date of Patent: *Mar. 7, 2023

(54) DATA STORAGE DEVICES INCLUDING A FIRST TOP ELECTRODE AND A DIFFERENT SECOND TOP ELECTRODE THEREON

(71) Applicant: Samsung Electronics Co., Ltd., Suwon-si (KR)

(72) Inventors: Junghwan Park, Seoul (KR); Younghyun Kim, Seoul (KR); Se Chung Oh, Yongin-si (KR); Jungmin Lee, Gwangmyeong-si (KR); Kyungil Hong, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/582,628

(22) Filed: Jan. 24, 2022

(65) Prior Publication Data

US 2022/0149270 A1 May 12, 2022

Related U.S. Application Data

(63) Continuation of application No. 16/803,574, filed on Feb. 27, 2020, now Pat. No. 11,271,037.

(30) Foreign Application Priority Data

Jul. 9, 2019 (KR) .................. 10-2019-0082784

(51) Int. Cl.
*H01L 27/22* (2006.01)
*H01L 43/10* (2006.01)
(Continued)

(52) U.S. Cl.
CPC .......... *H01L 27/228* (2013.01); *H01L 27/226* (2013.01); *H01L 43/02* (2013.01);
(Continued)

(58) Field of Classification Search
CPC ..... H01L 27/228; H01L 27/226; H01L 43/02; H01L 43/04; H01L 43/065; H01L 43/08; H01L 43/10; H01L 43/12
See application file for complete search history.

(56) References Cited

U.S. PATENT DOCUMENTS

| 7,863,911 B2 | 1/2011 | Hong et al. |
| 7,948,044 B2 | 5/2011 | Horng et al. |

(Continued)

FOREIGN PATENT DOCUMENTS

| KR | 101389236 B1 | 4/2014 |
| KR | 101575852 B1 | 12/2015 |
| KR | 101581160 B1 | 12/2015 |

*Primary Examiner* — Marc Anthony Armand
(74) *Attorney, Agent, or Firm* — Myers Bigel, P.A.

(57) ABSTRACT

Data storage devices are provided. A data storage device includes a memory transistor on a substrate and a data storage structure electrically connected to the memory transistor. The data storage structure includes a magnetic tunnel junction pattern and a top electrode on the magnetic tunnel junction pattern. The top electrode includes a first top electrode and a second top electrode on the first top electrode, and the first and second top electrodes include the same metal nitride. The first top electrode includes first crystal grains of the metal nitride, and the second top electrode includes second crystal grains of the metal nitride. In a section of the top electrode, the number of the first crystal grains per a unit length is greater than the number of the second crystal grains per the unit length.

20 Claims, 10 Drawing Sheets

(51) Int. Cl.
 *H01L 43/08* (2006.01)
 *H01L 43/12* (2006.01)
 *H01L 43/02* (2006.01)
 *H01L 43/04* (2006.01)
 *H01L 43/06* (2006.01)

(52) U.S. Cl.
 CPC ............ *H01L 43/04* (2013.01); *H01L 43/065* (2013.01); *H01L 43/08* (2013.01); *H01L 43/10* (2013.01); *H01L 43/12* (2013.01)

(56) References Cited

U.S. PATENT DOCUMENTS

| | | |
|---|---|---|
| 3,027,185 A1 | 9/2011 | Worledge et al. |
| 8,633,720 B2 | 1/2014 | Tudosa et al. |
| 9,252,187 B2 | 2/2016 | Wang et al. |
| 2006/0056114 A1 | 3/2006 | Fukumoto et al. |
| 2009/0227045 A1 | 9/2009 | Li |
| 2012/0112298 A1* | 5/2012 | Kim ................... H01L 43/10 257/E29.323 |
| 2013/0188418 A1 | 7/2013 | Chiang et al. |
| 2017/0110651 A1* | 4/2017 | Park ................... H01L 27/222 |
| 2018/0358070 A1* | 12/2018 | Song ................... H01L 43/12 |

* cited by examiner

DATA STORAGE DEVICES INCLUDING A FIRST TOP ELECTRODE AND A DIFFERENT SECOND TOP ELECTRODE THEREON

CROSS-REFERENCE TO RELATED APPLICATION(S)

This U.S. non-provisional patent application is a continuation of U.S. patent application Ser. No. 16/803,574, filed on Feb. 27, 2020, which claims priority under 35 U.S.C. § 119 to Korean Patent Application No. 10-2019-0082784, filed on Jul. 9, 2019, in the Korean Intellectual Property Office, the entire contents of which are hereby incorporated by reference.

BACKGROUND

The present disclosure relates to semiconductor devices and methods of fabricating the same and, in particular, to data storage devices including a magnetic tunnel junction and methods of fabricating the same. As electronic devices with high speed and/or low power consumption properties are needed, there is an increasing demand for semiconductor memory devices with faster operating speeds and/or lower operating voltages. Magnetic memory devices have been proposed to satisfy such a demand. For example, magnetic memory devices can provide technical advantages, such as high speed and/or non-volatility, and thus magnetic memory devices are emerging as next-generation memory devices.

A magnetic memory device typically includes a magnetic tunnel junction (MTJ). The MTJ includes two magnetic layers and an insulating layer interposed therebetween. Resistance of the MTJ varies depending on magnetization directions of the magnetic layers. For example, the resistance of the MTJ is higher when magnetization directions of the magnetic layers are anti-parallel to each other than when they are parallel to each other. Such a difference in resistance can be used for data storing operations of the magnetic memory device. However, more research may still be performed to help satisfy demand for magnetic memory devices with higher integration density and lower power consumption properties.

SUMMARY

Some embodiments of the inventive concepts provide a data storage device with reduced process defects and a method of fabricating the same. Moreover, some embodiments of the inventive concepts provide a data storage device with high reliability and a method of fabricating the same.

According to some embodiments of the inventive concepts, a data storage device may include a memory transistor on a substrate and a data storage structure electrically connected to the memory transistor. The data storage structure may include a magnetic tunnel junction pattern and a top electrode on the magnetic tunnel junction pattern. The top electrode may include a first top electrode and a second top electrode on the first top electrode, and the first and second top electrodes may contain the same metal nitride. The first top electrode may include first crystal grains of the metal nitride, and the second top electrode may include second crystal grains of the metal nitride. In a section of the top electrode, the number of the first crystal grains distributed in a unit length may be greater than the number of the second crystal grains distributed in the unit length.

According to some embodiments of the inventive concepts, a data storage device may include a memory transistor on a substrate and a data storage structure electrically connected to the memory transistor. The data storage structure may include a bottom electrode electrically connected to the memory transistor, a magnetic tunnel junction pattern on the bottom electrode, and a top electrode on the magnetic tunnel junction pattern. The top electrode may include a first top electrode and a second top electrode on the first top electrode, and the first and second top electrodes may contain the same metal nitride. A thickness of the first top electrode may be smaller than a thickness of the second top electrode, and a density of the first top electrode may be higher than a density of the second top electrode.

According to some embodiments of the inventive concepts, a data storage device may include a memory transistor on a substrate, an interconnection structure electrically connected to the memory transistor, a cell contact plug on the interconnection structure, a conductive line on the cell contact plug, and a data storage structure interposed between the cell contact plug and the conductive line. The data storage structure may include a bottom electrode electrically connected to the cell contact plug, a top electrode electrically connected to the conductive line, a magnetic tunnel junction pattern between the bottom electrode and the top electrode, and a capping pattern between the magnetic tunnel junction pattern and the top electrode. The top electrode may include a first top electrode, a second top electrode on the first top electrode, and an interface layer between the first and second top electrodes. The first and second top electrodes may include the same metal nitride, and a ratio of a thickness of the first top electrode to a total thickness of the top electrode may range from 0.05 to 0.2.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
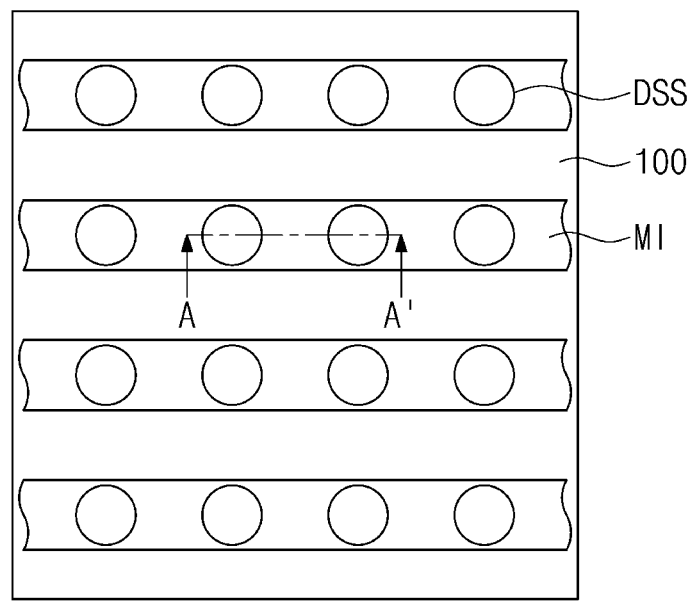
FIG. 1 is a plan view illustrating a data storage device according to some embodiments of the inventive concepts.
Figure 1:
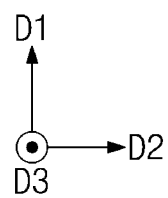
Figure 2:
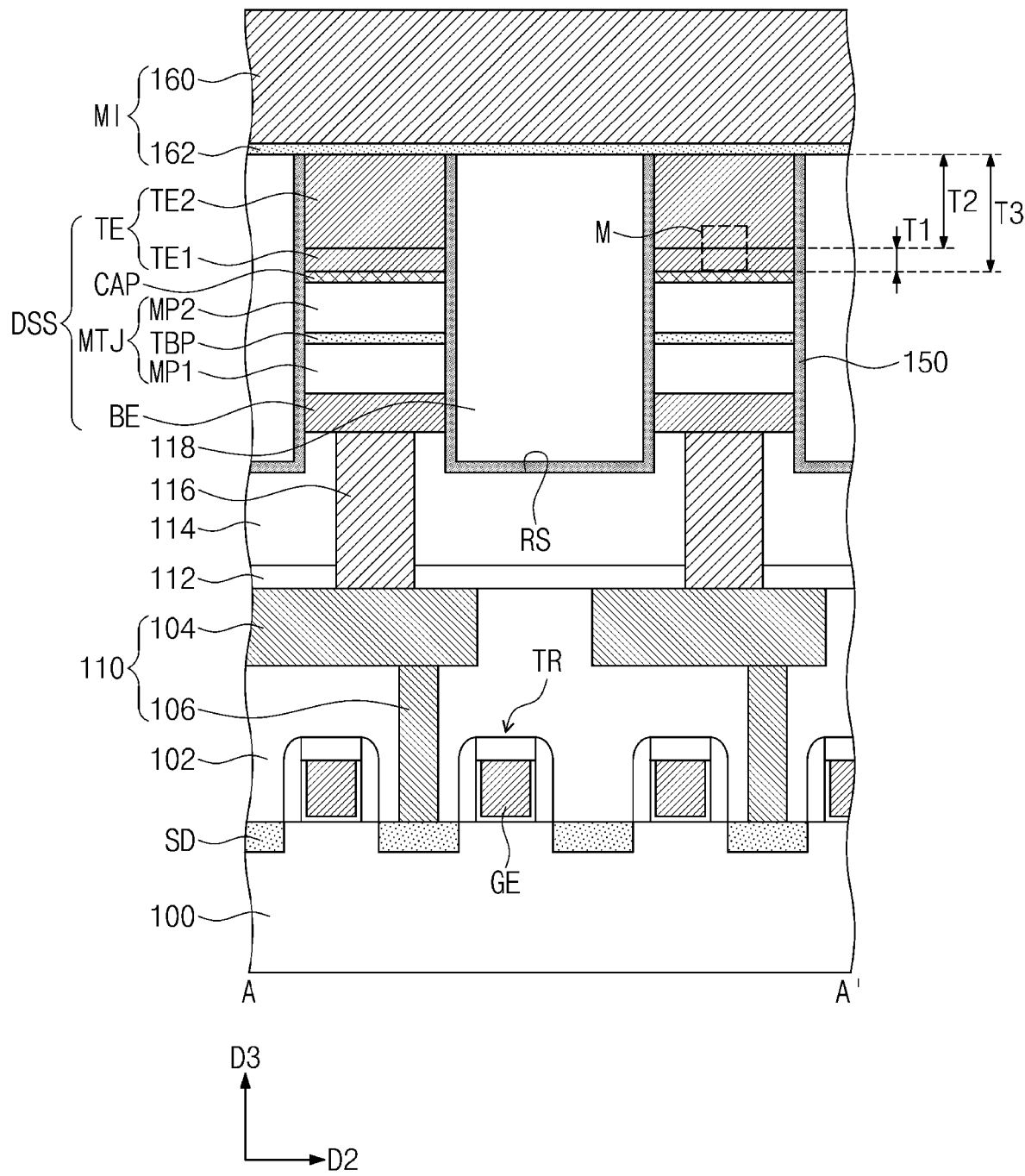
FIG. 2 is a sectional view taken along a line A-A' of FIG. 1.
Figure 3:
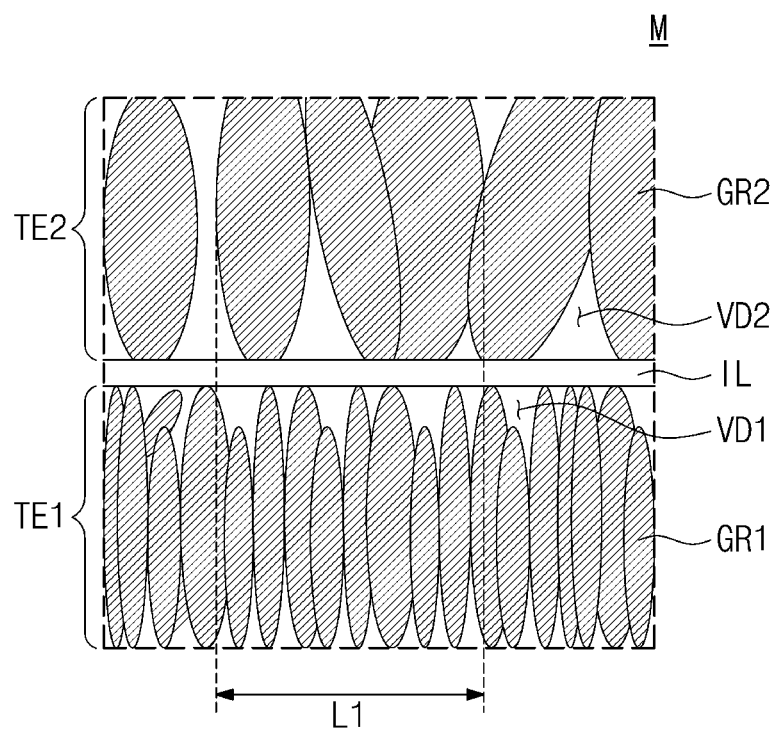
FIG. 3 is an enlarged sectional view of a portion 'M' of FIG. 2.
Figure 4A:
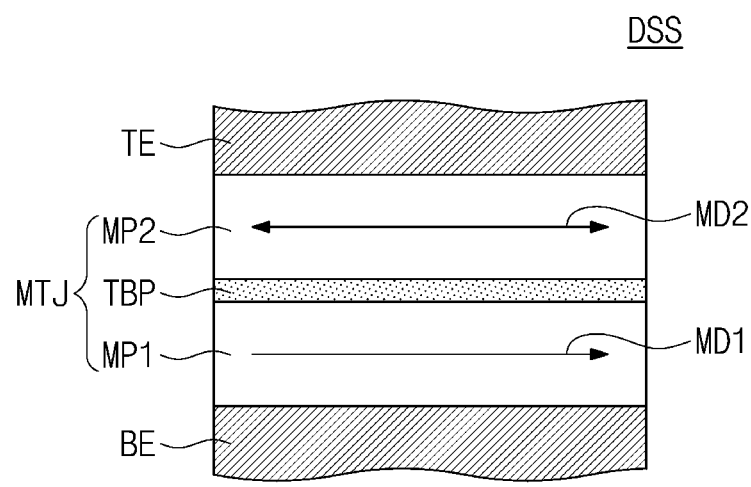
FIG. 4A is a sectional view illustrating an example of a data storage structure according to some embodiments of the inventive concepts.
Figure 4B:
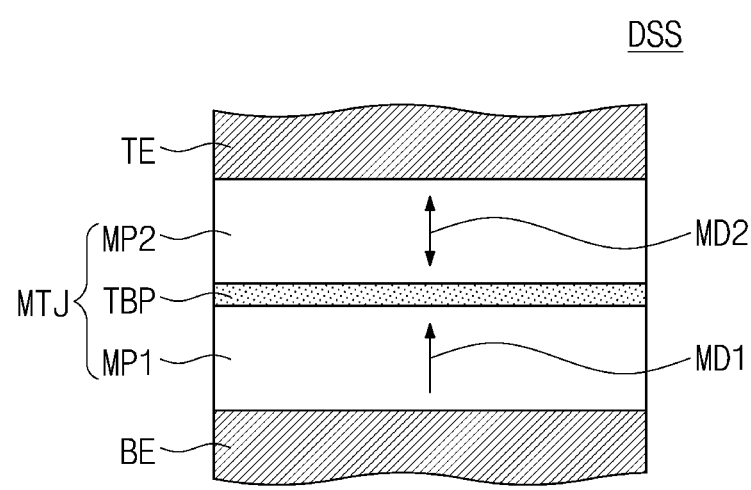
FIG. 4B is a sectional view illustrating another example of a data storage structure according to some embodiments of the inventive concepts.
Figure 5:
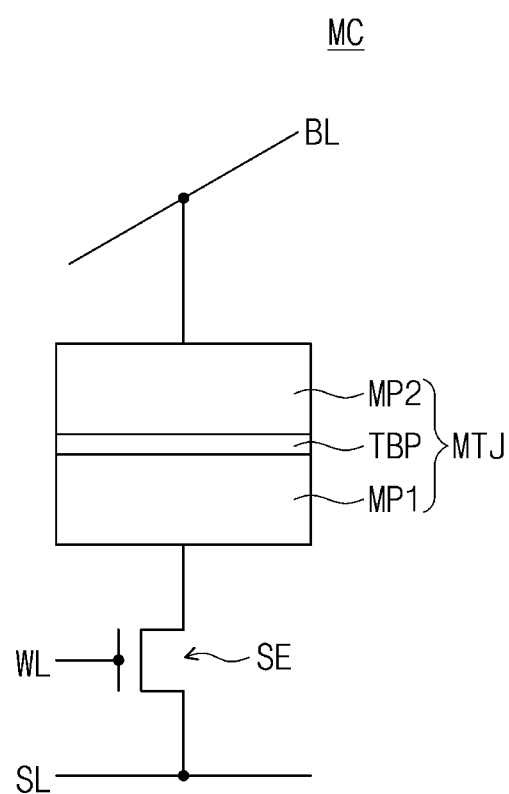
FIG. 5 is a diagram illustrating a unit memory cell of a data storage device according to some embodiments of the inventive concepts.

FIG. 1 is a plan view illustrating a data storage device according to some embodiments of the inventive concepts. FIG. 2 is a sectional view taken along a line A-A' of FIG. 1. FIG. 3 is an enlarged sectional view of a portion 'M' of FIG. 2. FIG. 4A is a sectional view illustrating an example of a data storage structure according to some embodiments of the inventive concepts. FIG. 4B is a sectional view illustrating another example of a data storage structure according to some embodiments of the inventive concepts. FIG. 5 is a diagram illustrating a unit memory cell of a data storage device according to some embodiments of the inventive concepts.

Referring to FIGS. 1 to 3, a substrate 100 may be provided. The substrate 100 may include a cell region, in which memory cells are provided. The substrate 100 may be a semiconductor substrate, such as silicon, silicon-on-insulator (SOI), silicon germanium (SiGe), germanium (Ge), and gallium arsenide (GaAs) wafers.

Memory transistors TR may be provided on the substrate 100. Each of the memory transistors TR may include a gate electrode GE on the substrate 100 and source/drain regions SD at both (e.g., opposite) sides of the gate electrode GE. A first interlayer insulating layer 102 may be provided to cover the memory transistors TR. As an example, the first interlayer insulating layer 102 may be formed of or include at least one of silicon oxide, silicon nitride, or silicon oxynitride.

Interconnection structures 110 may be provided in the first interlayer insulating layer 102. Each of the interconnection structures 110 may include an interconnection line 104, which is disposed in an upper portion of the first interlayer insulating layer 102, and a contact plug 106, which is provided between a source/drain region SD of the substrate 100 and the interconnection line 104. The contact plug 106 may electrically connect the interconnection line 104 to the memory transistor TR.

In some embodiments, the interconnection structures 110 may further include a plurality of interconnection layers, which are vertically stacked. The interconnection structures 110 may include a metallic material (e.g., copper (Cu)).

An intermediate layer 112 and a second interlayer insulating layer 114 may be provided on the first interlayer insulating layer 102. The intermediate layer 112 may be interposed between the first interlayer insulating layer 102 and the second interlayer insulating layer 114. As an example, the second interlayer insulating layer 114 may be formed of or include at least one of silicon oxide, silicon nitride, or silicon oxynitride. As an example, the intermediate layer 112 may be formed of or include carbon-containing silicon nitride.

Cell contact plugs 116 may be provided on the substrate 100, and the cell contact plugs 116 may be provided to penetrate the second interlayer insulating layer 114 and the intermediate layer 112 and may be connected to the interconnection structures 110. Each of the cell contact plugs 116 may be in contact with the interconnection line 104 of the interconnection structure 110. In some embodiments, the cell contact plugs 116 may be formed of or include at least one of doped semiconductor materials (e.g., doped silicon), metals (e.g., tungsten, titanium, or tantalum), conductive metal nitrides (e.g., titanium nitride, tantalum nitride, or tungsten nitride), or metal-semiconductor compounds (e.g., metal silicide).

Data storage structures DSS may be provided on the second interlayer insulating layer 114. When viewed in a plan view, the data storage structures DSS may be two-dimensionally arranged in a first direction D1 and a second direction D2 crossing each other. The data storage structures DSS may be coupled to the cell contact plugs 116, respectively.

Each of the data storage structures DSS may include a magnetic tunnel junction pattern MTJ, a bottom electrode BE, which is disposed between the cell contact plug 116 and the magnetic tunnel junction pattern MTJ, and a top electrode TE, which is spaced apart from the bottom electrode BE with the magnetic tunnel junction pattern MTJ interposed therebetween. The bottom electrode BE may be in direct contact with a top surface of the cell contact plug 116. The bottom electrode BE may be formed of or include at least one of conductive metal nitrides (e.g., titanium nitride, tantalum nitride, or tungsten nitride).

The magnetic tunnel junction pattern MTJ may include a first magnetic pattern MP1, a second magnetic pattern MP2, and a tunnel barrier pattern TBP therebetween. The first magnetic pattern MP1 may be disposed between the bottom electrode BE and the tunnel barrier pattern TBP, and the second magnetic pattern MP2 may be disposed between the top electrode TE and the tunnel barrier pattern TBP.

Each of the data storage structures DSS may further include a capping pattern CAP, which is provided between the magnetic tunnel junction pattern MTJ and the top electrode TE. The capping pattern CAP may be formed of or include a metallic material, such as ruthenium.

The top electrode TE may include a first top electrode TE1 and a second top electrode TE2 on the first top electrode TE1. The first top electrode TE1 may be provided on the capping pattern CAP.

Each of the first top electrode TE1 and the second top electrode TE2 may be formed of or include at least one of conductive metal nitrides (e.g., titanium nitride, tantalum nitride, or tungsten nitride). In some embodiments, the first top electrode TE1 and the second top electrode TE2 may be formed of or include the same metal nitride. For example, both of the first top electrode TE1 and the second top electrode TE2 may be formed of or include titanium nitride. In some embodiments, the first top electrode TE1 and the second top electrode TE2 may be formed of or include different metal nitrides from each other. For example, the first top electrode TE1 may be formed of or include titanium nitride, and the second top electrode TE2 may be formed of or include tantalum nitride.

A sheet resistance of the first top electrode TE1 may be different from a sheet resistance of the second top electrode TE2. A thickness T1 of the first top electrode TE1 may be smaller than a thickness T2 of the second top electrode TE2. A ratio of the thickness T1 of the first top electrode TE1 to a total thickness T3 of the top electrode TE (i.e., T1/T3) may range from 0.05 to 0.2. As an example, the thickness T1 of the first top electrode TE1 may range from 50 angstroms (Å) to 100 Å. The total thickness T3 of the top electrode TE may range from 250 Å to 800 Å.

The total thickness T3 of the top electrode TE may be 1.2 to 1.9 times a thickness of the magnetic tunnel junction pattern MTJ. When the total thickness T3 of the top electrode TE is smaller than 1.2 times the thickness of the magnetic tunnel junction pattern MTJ, a metallic element (e.g., Cu) in a conductive line MI, which will be described below, may be easily diffused into the tunnel barrier pattern TBP in the magnetic tunnel junction pattern MTJ. In this case, characteristics of the magnetic tunnel junction pattern MTJ may be deteriorated. When the total thickness T3 of the top electrode TE is greater than 1.9 times the thickness of the magnetic tunnel junction pattern MTJ, it may be difficult to etch a magnetic tunnel junction layer during an etching process for forming the magnetic tunnel junction pattern MTJ.

Referring to FIG. 3, the first top electrode TE1 may include first crystal grains GR1. The second top electrode TE2 may include second crystal grains GR2. In some embodiments, the first and second crystal grains GR1 and GR2 may be a crystal (e.g., a polyhedral shape) that is formed by regularly-arranged atoms of metal nitride.

A mean size of the first crystal grains GR1 may be smaller than a mean size of the second crystal grains GR2. As an example, the second crystal grains GR2 may have a larger mean width (in the second direction D2) than the first crystal grains GR1, and may vertically overlap (in the third direction D3) the first crystal grains GR1. A density of the first crystal grains GR1 may be higher than a density of the second crystal grains GR2. For example, in the sectional view of FIG. 3, the number of the first crystal grains GR1 distributed in a unit length L1 may be greater than the number of the second crystal grains GR2 distributed in the unit length L1.

In other words, a density of the first top electrode TE1 may be higher than a density of the second top electrode TE2. The first top electrode TE1 thus may be denser than the second top electrode TE2. For example, the density of the first top electrode TE1 may range from 50 grams per cubic centimeter (g/cm$^3$) to 70 g/cm$^3$, and the density of the second top electrode TE2 may range from 30 g/cm$^3$ to 50 g/cm$^3$.

A first void VD1 may be defined between the first crystal grains GR1, and a second void VD2 may be defined between the second crystal grains GR2. A size of the first void VD1 may be smaller than a size of the second void VD2. For example, a total volume of the first void VD1 in the first top electrode TE1 may be smaller than a total volume of the second void VD2 in the second top electrode TE2. Boundaries between the first and second crystal grains GR1 and GR2, which are adjacent to each other and meet each other, may be defined as grain boundaries.

An interface layer IL may be provided between the first top electrode TE1 and the second top electrode TE2. The interface layer IL may be formed of or include at least one among various metal oxides (e.g., titanium oxide).

Referring back to FIGS. 1 and 2, an upper portion of the second interlayer insulating layer 114 may include recess regions RS. Each of the recess regions RS may be located between adjacent ones of the data storage structures DSS. In other words, when viewed in a plan view, the recess regions RS may not be overlapped by the data storage structures DSS.

A protection insulating layer 150 may be provided on the second interlayer insulating layer 114 and the data storage structures DSS to cover them. The protection insulating layer 150 may cover a top surface of the second interlayer insulating layer 114 and side surfaces of the data storage structures DSS. As an example, the protection insulating layer 150 may be formed of or include silicon nitride. A third interlayer insulating layer 118 may be provided on the protection insulating layer 150. As an example, the third interlayer insulating layer 118 may be formed of or include at least one of silicon oxide, silicon nitride, or silicon oxynitride.

Conductive lines MI may be provided on/in the third interlayer insulating layer 118. The conductive lines MI may be arranged in the first direction D1. The conductive lines MI may be extended in the second direction D2 to be parallel to each other. Each of the conductive lines MI may be electrically connected to the data storage structures DSS, which are arranged in the second direction D2. For example, each conductive line MI may be in contact with top electrodes TE of the data storage structures DSS. The conductive lines MI may serve as respective bit lines of the data storage device according to some embodiments.

Each of the conductive lines MI may include a conductive pattern 160 and a barrier pattern 162. The barrier pattern 162 may cover bottom and side surfaces of the conductive pattern 160. The barrier pattern 162 may not cover a top surface of the conductive pattern 160. The conductive pattern 160 may be formed of or include a metallic material (e.g., Cu), and the barrier pattern 162 may be formed of or include a conductive metal nitride.

Hereinafter, the data storage structures DSS will be described in more detail with reference to FIGS. 4A and 4B. Referring first to FIG. 4A, the magnetic tunnel junction pattern MTJ of the data storage structure DSS may include the first magnetic pattern MP1, the second magnetic pattern MP2, and a tunnel barrier TBP therebetween.

The first magnetic pattern MP1 may have a magnetization direction MD1 that is fixed to a specific direction, and the second magnetic pattern MP2 may have a magnetization direction MD2 that can be changed to be parallel or antiparallel to the magnetization direction MD1 of the first magnetic pattern MP1. In other words, the first magnetic pattern MP1 may be a reference layer, and the second magnetic pattern MP2 may be a free layer.

The magnetization directions MD1 and MD2 of the first and second magnetic patterns MP1 and MP2 may be parallel to an interface between the tunnel barrier TBP and the second magnetic pattern MP2. Although FIG. 4A illustrates an example in which the second magnetic pattern MP2 is interposed between the tunnel barrier TBP and the top electrode TE, the inventive concepts are not limited to this example. For example, the second magnetic pattern MP2 may be interposed between the tunnel barrier TBP and the bottom electrode BE, unlike that shown in FIG. 4A.

The first magnetic pattern MP1, the tunnel barrier TBP, and the second magnetic pattern MP2 may constitute a magnetic tunnel junction. When the magnetization directions MD1 and MD2 of the first and second magnetic patterns MP1 and MP2 are parallel to the interface between the tunnel barrier TBP and the second magnetic pattern MP2, each of the first and second magnetic patterns MP1 and MP2 may include a ferromagnetic material. In some embodiments, the first magnetic pattern MP1 may further include an anti-ferromagnetic material to fix a magnetization direction of the ferromagnetic material therein.

The tunnel barrier pattern TBP may be formed of or include at least one of magnesium oxide, titanium oxide, aluminum oxide, magnesium-zinc oxide, or magnesium-boron oxide.

Referring to FIG. 4B, the magnetic tunnel junction pattern MTJ may include the first magnetic pattern MP1, the second magnetic pattern MP2, and the tunnel barrier TBP therebetween. The first magnetic pattern MP1 may have the magnetization direction MD1 that is fixed to a specific direction, and the second magnetic pattern MP2 may have the magnetization direction MD2 that can be changed to be parallel or antiparallel to the magnetization direction MD1 of the first magnetic pattern MP1.

The magnetization directions MD1 and MD2 of the first and second magnetic patterns MP1 and MP2 may be perpendicular to an interface between the tunnel barrier TBP and the second magnetic pattern MP2. FIG. 4B illustrates an example in which the second magnetic pattern MP2 is interposed between the tunnel barrier TBP and the top electrode TE, but the inventive concepts are not limited to this example. For example, in some embodiments, the second magnetic pattern MP2 may be interposed between the tunnel barrier TBP and the bottom electrode BE, unlike that shown in FIG. 4B.

The first magnetic pattern MP1, the tunnel barrier TBP, and the second magnetic pattern MP2 may constitute a magnetic tunnel junction. In the case where the magnetization directions MD1 and MD2 of the first and second magnetic patterns MP1 and MP2 are perpendicular to the interface between the tunnel barrier TBP and the second magnetic pattern MP2, each of the first and second magnetic patterns MP1 and MP2 may include at least one of perpendicular magnetic materials (e.g., cobalt-iron-terbium (CoFeTb), cobalt-iron-gadolinium (CoFeGd), or cobalt-iron-dysprosium (CoFeDy)), perpendicular magnetic materials with $L1_o$ structure, cobalt-platinum (CoPt)-based materials with hexagonal-close-packed structure, and perpendicular magnetic structures. The perpendicular magnetic material with the $L1_o$ structure may include at least one of $L1_o$ iron-platinum (FePt), $L1_o$ iron-palladium (FePd), $L1_o$ cobalt-palladium (CoPd), or $L1_o$ CoPt. The perpendicular magnetic structures may include magnetic layers and non-magnetic layers that are alternately and repeatedly stacked. For example, the perpendicular magnetic structures may include at least one of (Co/Pt)n, (CoFe/Pt)n, (CoFe/Pd)n, (Co/Pd)n, (Co/nickel (Ni))n, (CoNi/Pt)n, (Co-chromium (Cr)/Pt)n, or (CoCr/Pd)n, where n denotes the number of stacking.

Referring to FIG. 5, a unit memory cell MC may include the magnetic tunnel junction pattern MTJ and a selection element SE corresponding thereto. The magnetic tunnel junction pattern MTJ and the selection element SE may be electrically connected in series. The magnetic tunnel junction pattern MTJ may be provided between and connected to a bit line BL and the selection element SE. The selection element SE may be provided between and connected to the magnetic tunnel junction pattern MTJ and a source line SL and may be controlled by a word line WL. As an example, the selection element SE may be the memory transistor TR previously described with reference to FIGS. 1 to 3.

The magnetic tunnel junction pattern MTJ may include a magnetic tunnel junction (MTJ), which includes the first and second magnetic patterns MP1 and MP2, which are spaced apart from each other, and a tunnel barrier pattern TBP therebetween. One of the first and second magnetic patterns MP1 and MP2 may be a reference layer whose magnetization direction is fixed independent of an external magnetic field generated in a typical usage environment. The other of the first and second magnetic patterns MP1 and MP2 may be a free layer whose magnetization direction can be easily switched to one of two stable magnetization directions by an external magnetic field.

An electrical resistance of the magnetic tunnel junction pattern MTJ may be much greater when the reference and free layers have antiparallel magnetization directions than when the reference and free layers have parallel magnetization directions. This means that the electrical resistance of the magnetic tunnel junction pattern MTJ can be controlled by changing the magnetization direction of the free layer. A difference in electrical resistance of the magnetic tunnel junction pattern MTJ, which is caused by a difference in magnetization direction between the reference and free layers, may be used as a data storing mechanism of the unit memory cell MC.

FIGS. 6 to 10 are sectional views illustrating a method of fabricating a data storage device according to some embodiments of the inventive concepts and corresponding to a line A-A' of FIG. 1.

Figure 6:
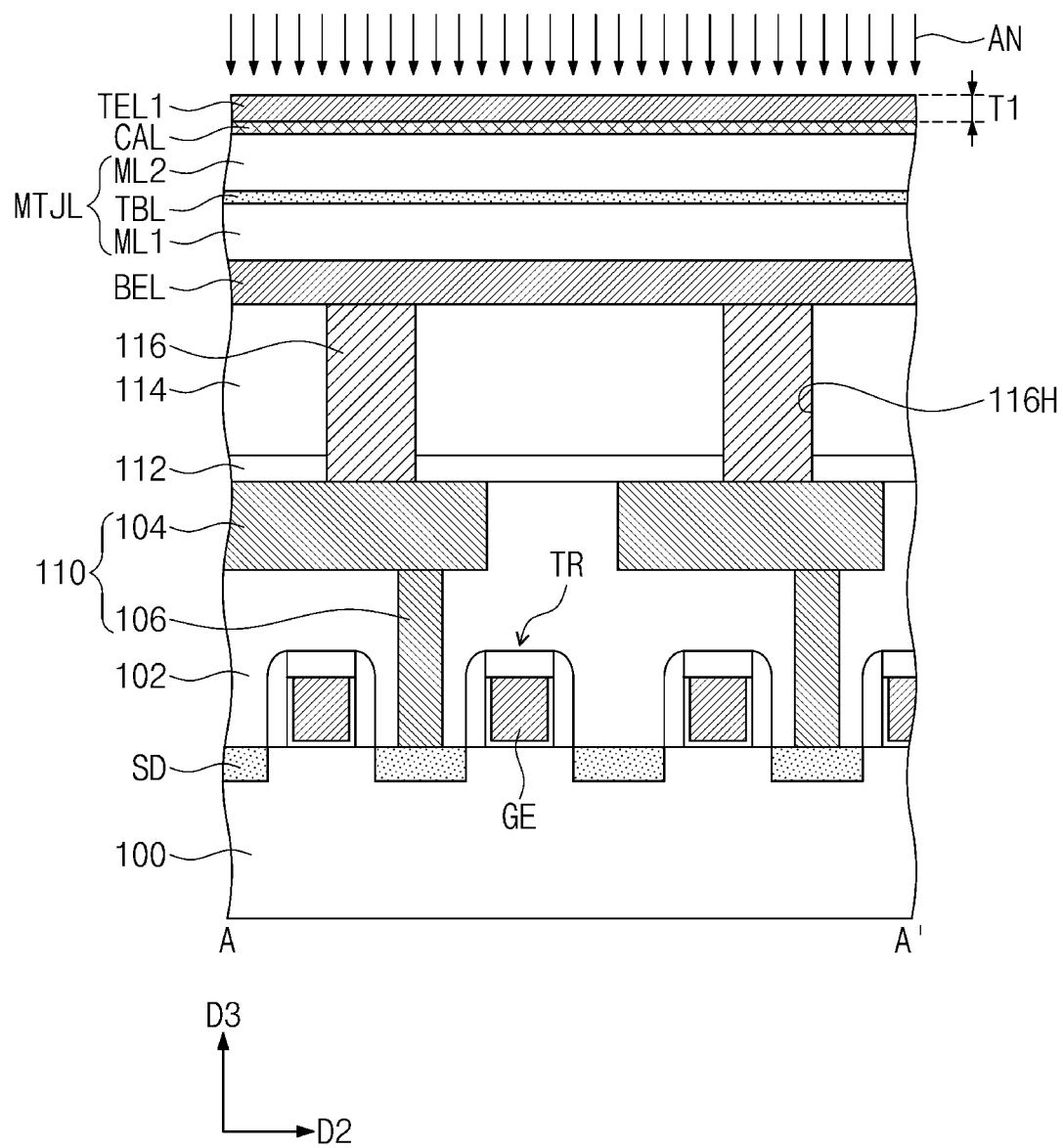
FIGS. 6 to 10 are sectional views illustrating a method of fabricating a data storage device according to some embodiments of the inventive concepts and corresponding to a line A-A' of FIG. 1.

Referring to FIGS. 1 and 6, the memory transistors TR may be formed on the substrate 100. The first interlayer insulating layer 102 may be formed on the substrate 100 to cover the memory transistors TR. The interconnection structures 110 may be formed on the substrate 100 and may be electrically connected to the memory transistors TR. As an example, the interconnection structures 110 may be formed of or include copper (Cu). The first interlayer insulating layer 102 may be formed of or include at least one of silicon oxide, silicon nitride, or silicon oxynitride.

The intermediate layer 112 and the second interlayer insulating layer 114 may be sequentially formed on the first interlayer insulating layer 102. The second interlayer insulating layer 114 may be formed of or include at least one of silicon oxide, silicon nitride, or silicon oxynitride, and the intermediate layer 112 may be formed of or include carbon-containing silicon nitride.

The cell contact plugs 116 may be formed on the substrate 100, and here, the cell contact plugs 116 may be provided to penetrate the second interlayer insulating layer 114 and the intermediate layer 112 and may be connected to the interconnection structures 110. The formation of the cell contact plugs 116 may include forming cell contact holes 116H to penetrate the second interlayer insulating layer 114 and the intermediate layer 112 and forming the cell contact plugs 116 in the cell contact holes 116H, respectively. The cell contact plugs 116 may be formed of or include at least one of doped semiconductor materials, metals, conductive metal nitrides, or metal-semiconductor compounds.

A bottom electrode layer BEL, a first magnetic layer ML1, the tunnel barrier layer TBL, a second magnetic layer ML2, a capping layer CAL, and a first top electrode layer TEL1 may be sequentially formed on the second interlayer insulating layer 114. The first magnetic layer ML1, the tunnel barrier layer TBL, and the second magnetic layer ML2 may constitute a magnetic tunnel junction layer MTJL. The bottom electrode layer BEL may be formed of or include at least one of metal nitrides (e.g., titanium nitride).

The first magnetic layer ML1, the tunnel barrier layer TBL, the second magnetic layer ML2, and the capping layer CAL may be formed of or include the same materials as the first magnetic pattern MP1, the tunnel barrier pattern TBP, the second magnetic pattern MP2, and the capping pattern CAP, respectively, which have been described above. Each, or at least one, of the bottom electrode layer BEL, the first magnetic layer ML1, the tunnel barrier layer TBL, the second magnetic layer ML2, and the capping layer CAL may be formed by a physical vapor deposition process (e.g., a sputtering process).

The first top electrode layer TEL1 may be directly formed on the capping layer CAL. The first top electrode layer TEL1 may be formed of or include at least one of conductive metal nitrides, such as titanium nitride, tantalum nitride, or tungsten nitride.

The first top electrode layer TEL1 may be formed using a physical vapor deposition (PVD) process, a chemical vapor deposition (CVD) process, or an atomic layer deposition (ALD) process. As an example, the first top electrode layer TEL1 may be formed using a physical vapor deposition process.

The first top electrode layer TEL1 may be formed by a physical vapor deposition process, which is performed using a relatively low power. Since the first top electrode layer TEL1 is formed using the low power, the first top electrode layer TEL1 may be formed to be dense. The first top electrode layer TEL1 may be formed to have the thickness T1 ranging from 50 Å to 100 Å.

An annealing process AN may be performed after the deposition of the first top electrode layer TEL1. During the annealing process AN, an upper portion of the first top electrode layer TEL1 may be oxidized, and as a result, the interface layer IL, which was previously described with reference to FIG. 3, may be formed on the first top electrode layer TEL1.

Figure 7:
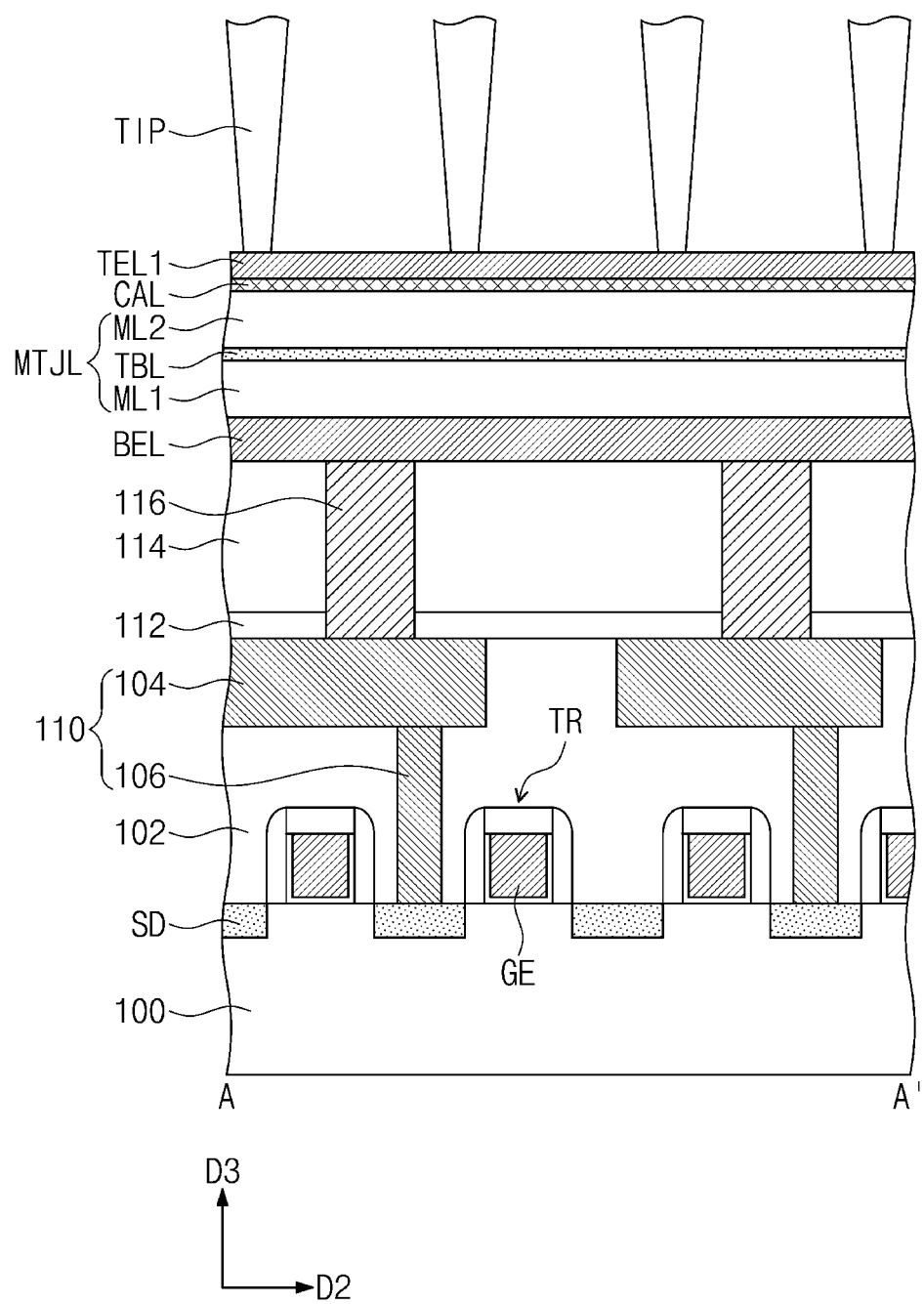

Referring to FIGS. 1 and 7, characteristics of the magnetic tunnel junction layer MTJL may be tested. For example, tips TIP of a probe may be placed on the first top electrode layer TEL1 to perform a current in-plane tunneling (CIPT) test. Resistance of the magnetic tunnel junction layer MTJL may be measured by the CIPT test. Furthermore, a magneto optical Kerr effect (MOKE) test may be performed on the first top electrode layer TEL1 to measure a coercive force of the magnetic tunnel junction layer MTJL. By performing the CIPT and MOKE tests, it may be possible to examine the characteristics of the magnetic tunnel junction layer MTJL and to perform a feedback operation thereon.

In the case where the top electrode on the magnetic tunnel junction layer MTJL is thick, it may be difficult to perform the MOKE test. In the case where the top electrode on the magnetic tunnel junction layer MTJL has poor surface roughness, it may be difficult to perform the CIPT test. According to some embodiments of the inventive concepts, since the first top electrode layer TEL1 is formed to have a relatively small thickness (e.g., T1) and then the MOKE test is performed, it may be possible to perform the MOKE test in an accurate and effective manner. Since the first top electrode layer TEL1 is densely formed by controlling the deposition process of the first top electrode layer TEL1, it may be possible to perform the CIPT test in an accurate and effective manner.

Figure 8:
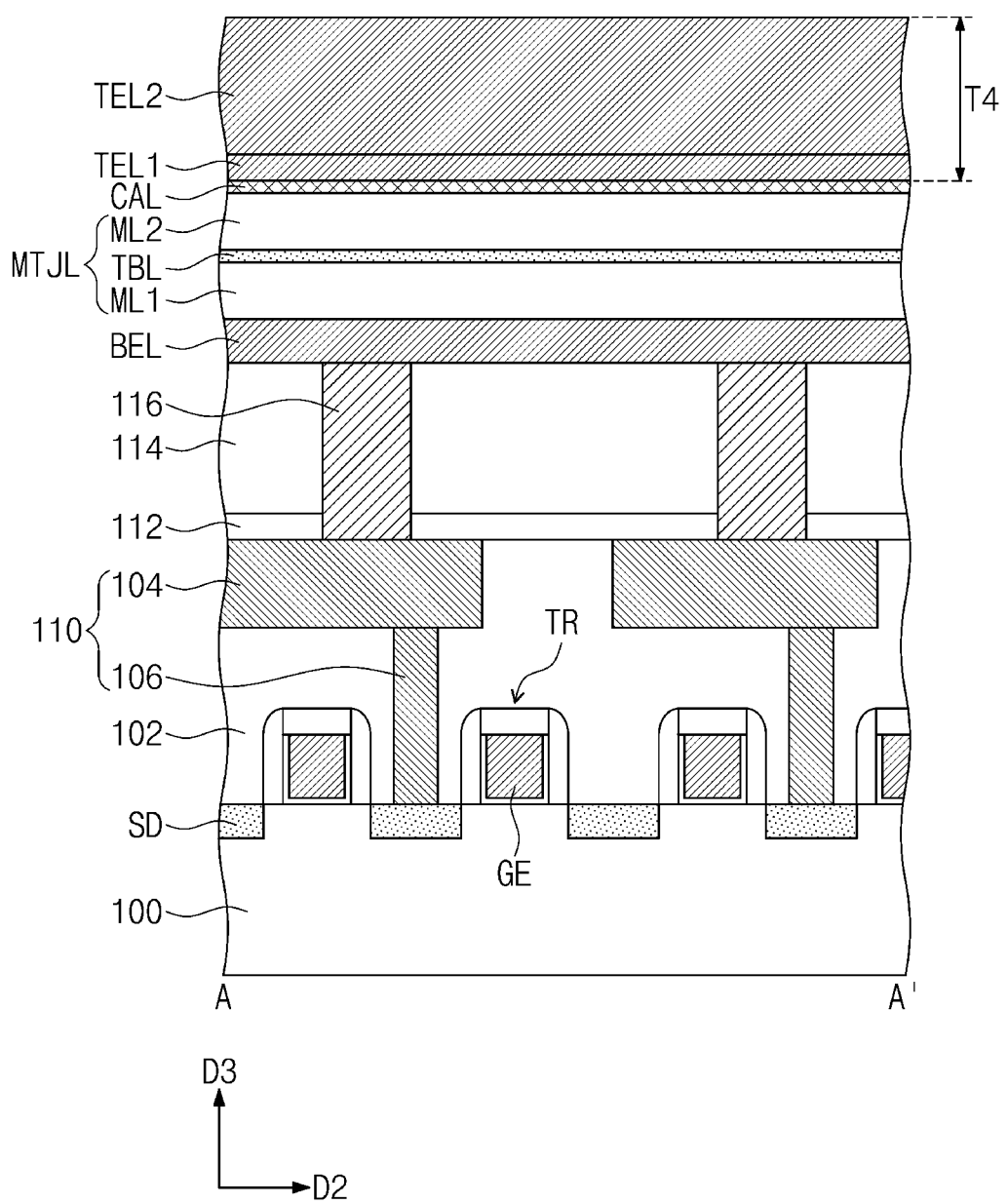

Referring to FIGS. 1 and 8, a second top electrode layer TEL2 may be formed on the first top electrode layer TEL1. The second top electrode layer TEL2 may be formed of or include at least one of conductive metal nitrides, such as titanium nitride, tantalum nitride, or tungsten nitride.

In some embodiments, the second top electrode layer TEL2 may be formed of or include the same metal nitride as the first top electrode layer TEL1. For example, both of the first and second top electrode layers TEL1 and TEL2 may be formed of or include titanium nitride. In some embodiments, the second top electrode layer TEL2 may be formed of or include a different metal nitride from the first top electrode layer TEL1. For example, the first top electrode layer TEL1 may be formed of or include titanium nitride, and the second top electrode layer TEL2 may be formed of or include tantalum nitride.

The second top electrode layer TEL2 may be formed using a physical vapor deposition (PVD) process, a chemical vapor deposition (CVD) process, or an atomic layer deposition (ALD) process. As an example, the second top electrode layer TEL2 may be formed using a physical vapor deposition process.

The second top electrode layer TEL2 may be formed by a physical vapor deposition process, which is performed using a higher power than that in the deposition process for the first top electrode layer TEL1. Since the second top electrode layer TEL2 is formed under the condition of high power, the second top electrode layer TEL2 may be formed to be less dense. The second top electrode layer TEL2 and the first top electrode layer TEL1 may be formed to have a collective thickness T4 ranging from 200 Å to 800 Å.

Figure 9:
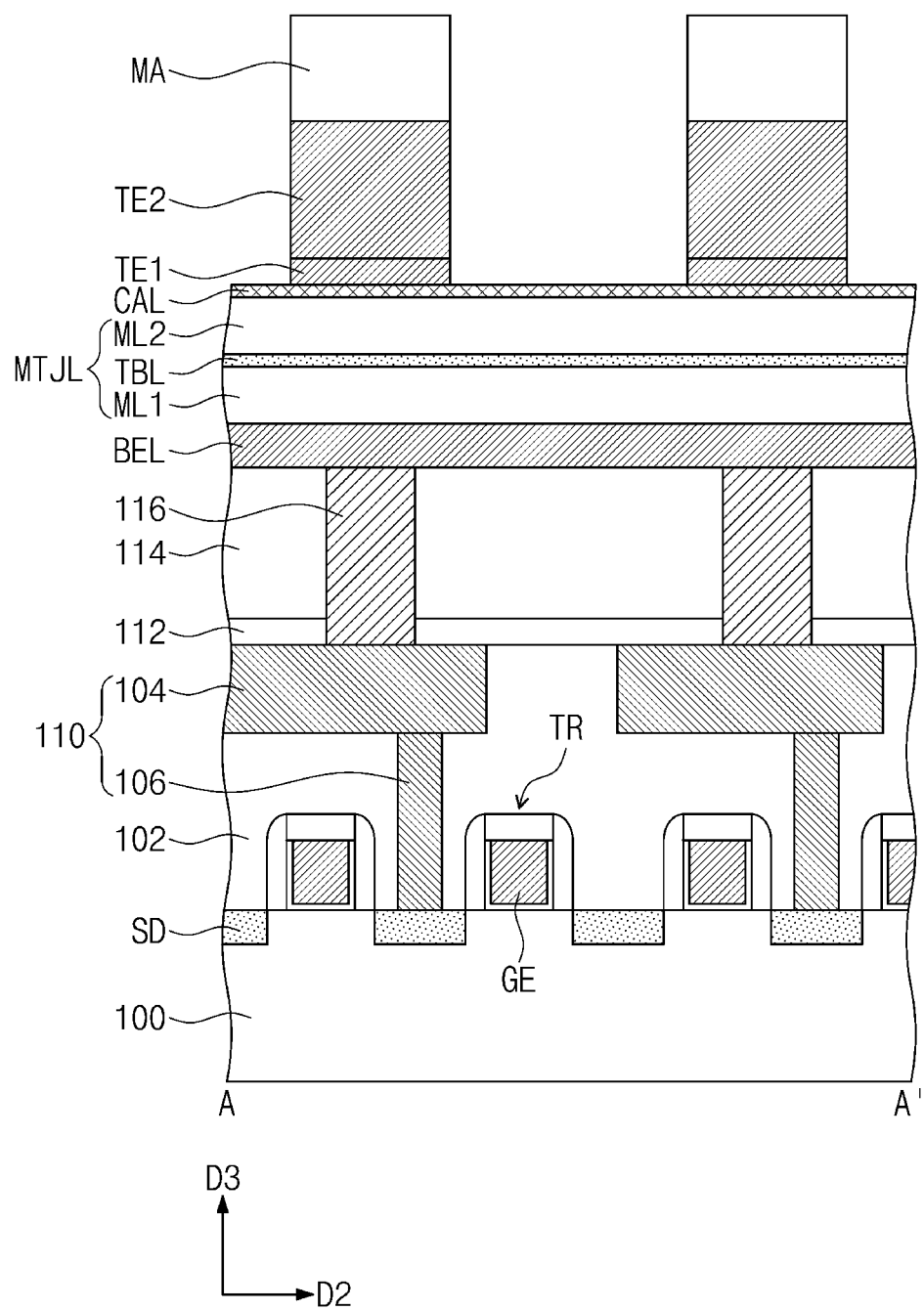

Referring to FIGS. 1 and 9, mask patterns MA may be formed on the second top electrode layer TEL2. The mask patterns MA may define regions on which the data storage structures DSS shown in FIG. 1 will be formed. The mask patterns MA may be formed of or include at least one of insulating materials (e.g., silicon oxide, silicon nitride, and/or silicon oxynitride).

The first top electrode layer TEL1 and the second top electrode layer TEL2 may be patterned using the mask patterns MA as an etch mask to form the first top electrode TE1 and the second top electrode TE2, respectively.

Figure 10:
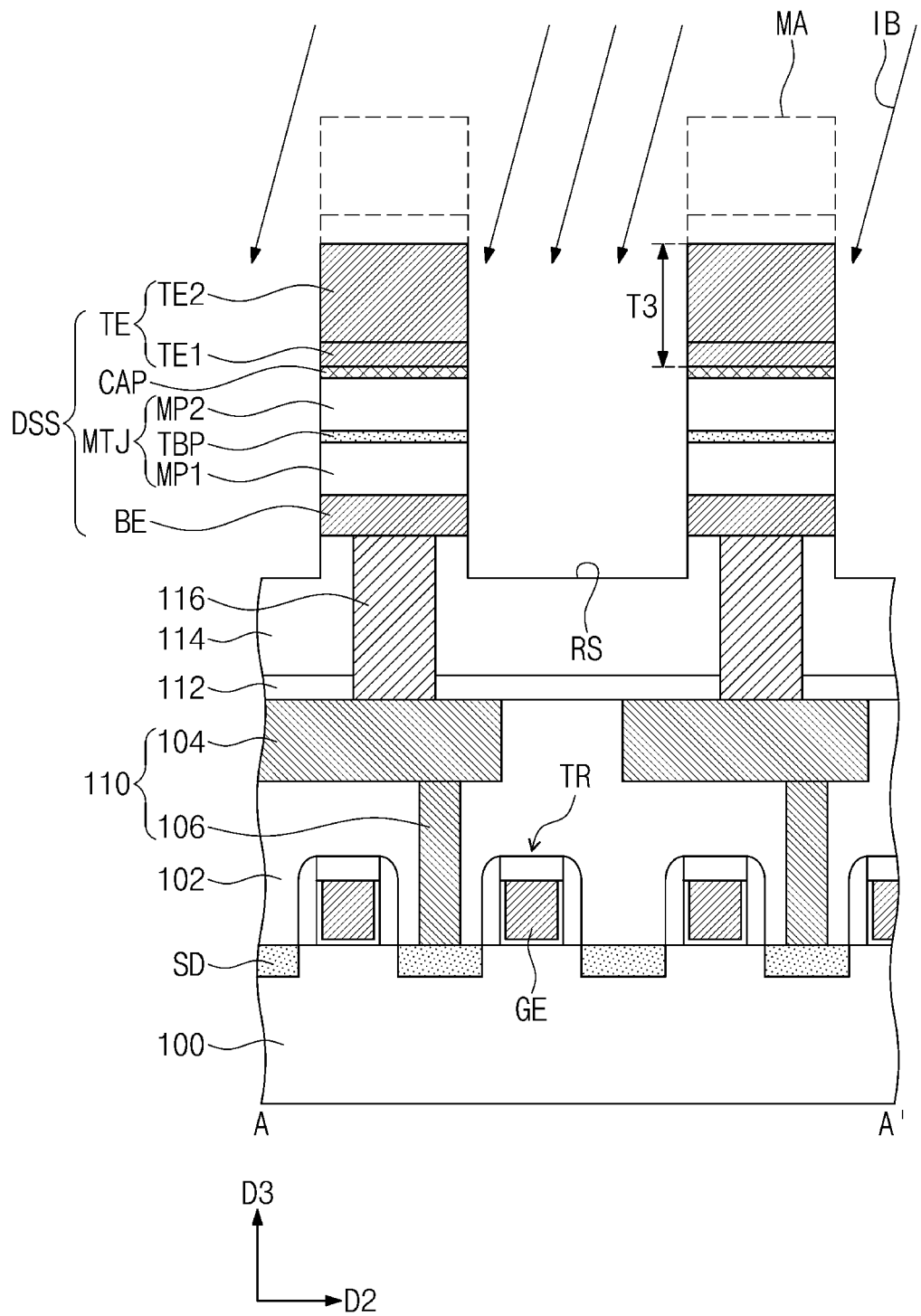

Referring to FIGS. 1 and 10, an etching process may be performed using the mask patterns MA and the first and second top electrodes TE1 and TE2 as a mask.

The etching process may be an ion beam etching process using an ion beam D3. The ion beam 1B may include, for example, positive ions of argon (Ar+).

The capping layer CAL, the magnetic tunnel junction layer MTJL, and the bottom electrode layer BEL may be sequentially etched by the etching process. The capping pattern CAP, the magnetic tunnel junction pattern MTJ, and the bottom electrode BE may be respectively formed by the etching of the capping layer CAL, the magnetic tunnel junction layer MTJL, and the bottom electrode layer BEL.

The magnetic tunnel junction pattern MTJ may include the first magnetic pattern MP1, the tunnel barrier pattern TBP, and the second magnetic pattern MP2, which are sequentially stacked on the bottom electrode BE. The mask patterns MA may be removed during the etching process. An upper portion of the second top electrode TE2 may be removed during the etching process. Accordingly, the total thickness T3 of the top electrode TE may range from 250 Å to 800 ∈.

Unlike that described with reference to FIG. 8, if the second top electrode layer TEL2 is not additionally formed on the first top electrode layer TEL1, the final top electrode TE may be too thin. In this case, a metallic element (e.g., Cu) may be easily diffused into the tunnel barrier pattern TBP in the magnetic tunnel junction pattern MTJ, in a subsequent process of forming the conductive line MI. By contrast, according to some embodiments of the inventive concepts, since the second top electrode layer TEL2 is additionally and thickly formed on the first top electrode layer TEL1, the top electrode TE may be formed to have the total thickness T3 that is 1.2 to 1.9 times the thickness of the magnetic tunnel junction pattern MTJ.

Upper portions of the second interlayer insulating layer 114, which is exposed between the data storage structures DSS, may be over-etched during the etching process.

Accordingly, the recess regions RS may be formed between the data storage structures DSS.

Referring back to FIGS. 1 and 2, the protection insulating layer 150 may be conformally formed on the data storage structures DSS and the second interlayer insulating layer 114. As an example, the protection insulating layer 150 may be formed using silicon nitride. The third interlayer insulating layer 118 may be formed on the protection insulating layer 150. As an example, the third interlayer insulating layer 118 may be formed using at least one of silicon oxide, silicon nitride, or silicon oxynitride.

The conductive lines MI may be formed on/in an upper portion of the third interlayer insulating layer 118. The formation of the conductive lines MI may include etching the third interlayer insulating layer 118 and the protection insulating layer 150 to form interconnection holes exposing the top electrodes TE of the data storage structures DSS and sequentially forming a barrier layer and a conductive layer in the interconnection holes.

According to some embodiments of the inventive concepts, a data storage device may be configured to be able to perform MOKE and CIPT tests on its first top electrode, and thus, it may be possible to reduce process defects and to improve reliability of the device. In addition, a second top electrode may be formed on the first top electrode, and thus, it may be possible to improve characteristics of the magnetic tunnel junction pattern.

While example embodiments of the inventive concepts have been particularly shown and described, it will be understood by one of ordinary skill in the art that variations in form and detail may be made therein without departing from the scope of the attached claims.

What is claimed is:

1. A data storage device comprising:
a transistor on a substrate; and
a data storage structure electrically connected to the transistor,
wherein the data storage structure comprises a magnetic tunnel junction pattern and a top electrode on the magnetic tunnel junction pattern,
wherein the top electrode comprises a first top electrode and a second top electrode on the first top electrode,
wherein the first and second top electrodes comprise a same metal nitride,
wherein the first top electrode comprises first crystal grains of the metal nitride,
wherein the second top electrode comprises second crystal grains of the metal nitride, and
wherein a first mean size of the first crystal grains of the metal nitride is different from a second mean size of the second crystal grains of the metal nitride.

2. The data storage device of claim 1, wherein the first mean size of the first crystal grains is smaller than the second mean size of the second crystal grains.

3. The data storage device of claim 1,
wherein the first mean size of the first crystal grains comprises a first mean width in a direction parallel to a top surface of the magnetic tunnel junction pattern,
wherein the second mean size of the second crystal grains comprises a second mean width in the direction, and
wherein the first mean width is smaller than the second mean width.

4. The data storage device of claim 1, wherein a ratio of a thickness of the first top electrode to a total thickness of the top electrode ranges from 0.05 to 0.2.

5. The data storage device of claim 4, wherein the total thickness of the top electrode is 1.2 to 1.9 times a thickness of the magnetic tunnel junction pattern.

6. The data storage device of claim 1,
wherein the data storage structure further comprises a capping pattern interposed between the magnetic tunnel junction pattern and the first top electrode, and
wherein the capping pattern comprises ruthenium.

7. The data storage device of claim 1,
wherein the first crystal grains have a first void therebetween,
wherein the second crystal grains have a second void therebetween, and
wherein a size of the first void is smaller than a size of the second void.

8. The data storage device of claim 1,
wherein the top electrode further comprises an interface layer between the first top electrode and the second top electrode, and
wherein the interface layer comprises at least one metal oxide.

9. The data storage device of claim 1, wherein the metal nitride comprises titanium nitride, tantalum nitride, or tungsten nitride.

10. The data storage device of claim 1,
wherein the magnetic tunnel junction pattern comprises a first magnetic pattern, a second magnetic pattern, and a tunnel barrier pattern therebetween,
wherein one of the first and second magnetic patterns is a reference layer, and
wherein the other of the first and second magnetic patterns is a free layer.

11. A data storage device comprising:
a transistor on a substrate; and
a data storage structure electrically connected to the transistor,
wherein the data storage structure comprises:
a bottom electrode electrically connected to the transistor;
a magnetic tunnel junction pattern on the bottom electrode; and
a top electrode on the magnetic tunnel junction pattern,
wherein the top electrode comprises a first top electrode and a second top electrode on the first top electrode,
wherein the first and second top electrodes comprise a same metal nitride, and
wherein a density of the first top electrode is higher than a density of the second top electrode.

12. The data storage device of claim 11,
wherein a thickness of the first top electrode is smaller than a thickness of the second top electrode, and
wherein a ratio of the thickness of the first top electrode to a total thickness of the top electrode ranges from 0.05 to 0.2.

13. The data storage device of claim 11,
wherein the data storage structure further comprises a capping pattern interposed between the magnetic tunnel junction pattern and the first top electrode, and
wherein the capping pattern comprises ruthenium.

14. The data storage device of claim 11,
wherein the top electrode further comprises an interface layer between the first top electrode and the second top electrode, and
wherein the interface layer comprises at least one metal oxide.

15. The data storage device of claim 11,
wherein the first top electrode comprises first crystal grains of the metal nitride,
wherein the second top electrode comprises second crystal grains of the metal nitride, and
wherein a first mean size of the first crystal grains of the metal nitride is smaller than a second mean size of the second crystal grains of the metal nitride.

16. A data storage device comprising:
a transistor on a substrate;
an interconnection structure electrically connected to the transistor;
a cell contact plug on the interconnection structure;
a conductive line on the cell contact plug; and
a data storage structure interposed between the cell contact plug and the conductive line,
wherein the data storage structure comprises:
   a bottom electrode electrically connected to the cell contact plug;
   a top electrode electrically connected to the conductive line;
   a magnetic tunnel junction pattern between the bottom electrode and the top electrode; and
   a capping pattern between the magnetic tunnel junction pattern and the top electrode,
wherein the top electrode comprises a first top electrode, a second top electrode on the first top electrode, and an interface layer between the first and second top electrodes,
wherein the first and second top electrodes comprise a same metal nitride,
wherein the first top electrode comprises first crystal grains of the metal nitride and a first void between the first crystal grains,
wherein the second top electrode comprises second crystal grains of the metal nitride and a second void between the second crystal grains,
wherein a size of the first void is different from a size of the second void.

17. The data storage device of claim 16, wherein the size of the first void is smaller than the size of the second void.

18. The data storage device of claim 16, wherein a first mean size of the first crystal grains is smaller than a second mean size of the second crystal grains.

19. The data storage device of claim 16, wherein a density of the first top electrode is higher than a density of the second top electrode.

20. The data storage device of claim 16, wherein the metal nitride comprises titanium nitride, tantalum nitride, or tungsten nitride.

* * * * *